(12) United States Patent
Wood et al.

(10) Patent No.: US 6,359,333 B1
(45) Date of Patent: *Mar. 19, 2002

(54) WAFER-PAIR HAVING DEPOSITED LAYER SEALED CHAMBERS

(75) Inventors: R. Andrew Wood, Bloomington; Jeffrey A. Ridley, Burnsville; Robert E. Higashi, Shorewood, all of MN (US)

(73) Assignee: Honeywell International Inc., Morristown, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/052,630

(22) Filed: Mar. 31, 1998

(51) Int. Cl.⁷ .............................................. H01L 23/12
(52) U.S. Cl. ...................... 257/704; 257/787; 174/52.3; 174/52.4
(58) Field of Search ............................. 174/52.3, 52.4; 257/704, 787

(56) References Cited

U.S. PATENT DOCUMENTS

| | | | | |
|---|---|---|---|---|
| 4,400,870 A | * | 8/1983 | Islam | 29/832 |
| 4,582,210 A | * | 4/1986 | Morimoto et al. | 220/2.2 |
| 4,833,102 A | * | 5/1989 | Byrne et al. | 228/121 |
| 4,897,508 A | * | 1/1990 | Mahulikar et al. | 174/52.4 |
| 5,420,419 A | * | 5/1995 | Wood | 250/338.4 |
| 5,528,452 A | | 6/1996 | Ko | 361/283.4 |
| 5,585,311 A | | 12/1996 | Ko | 437/228 |
| 5,729,019 A | * | 3/1998 | Krafthefer et al. | 250/353 |
| 5,865,417 A | * | 2/1999 | Harris et al. | 251/11 |
| 5,895,233 A | * | 4/1999 | Higashi et al. | 438/107 |

FOREIGN PATENT DOCUMENTS

EP 0736972 A 10/1996

OTHER PUBLICATIONS

Bauer D et al; "Design and Fabrication of a Thermal Infrared Emitter", Sensors and Actuators A, vol. 55, No. 1, Jul. 15, 1996, p. 57–63.

Mori T et al: "Vacuum–encapsulated Thermistor bolometer Type Miniature Infrared Sensor" Proceeding of the Workshop on Micro Electro Mechanica Systems (MEM, OISO, Jan. 25–28, 1994, No. Workshop 7, Jan. 25, 1994 pp. 257–262, Institute of Electrical and Electronics Engineers.

Kniffen M L et al: "Packaging for Silicon Micromachined Accerlerometers", International Journal of Microcircuits and Electronic Packaging, vol. 19, No. 1, Jan. 1, 1996 pp. 75–86.

* cited by examiner

Primary Examiner—Long Pham
Assistant Examiner—Scott A Brainton
(74) Attorney, Agent, or Firm—John G. Shudy, Jr.

(57) ABSTRACT

A wafer-pair having at least one recess in one wafer and the recess formed into a chamber with the attaching of the other wafer which has a port plugged with a deposited layer on its external surface. The deposition of the layer may be performed in a very low pressure environment, thus assuring the same kind of environment in the sealed chamber. The chamber may enclose at least one device such as a thermoelectric sensor, bolometer, emitter or other kind of device. The wafer-pair typically will have numerous chambers, and may be divided into chips.

17 Claims, 4 Drawing Sheets

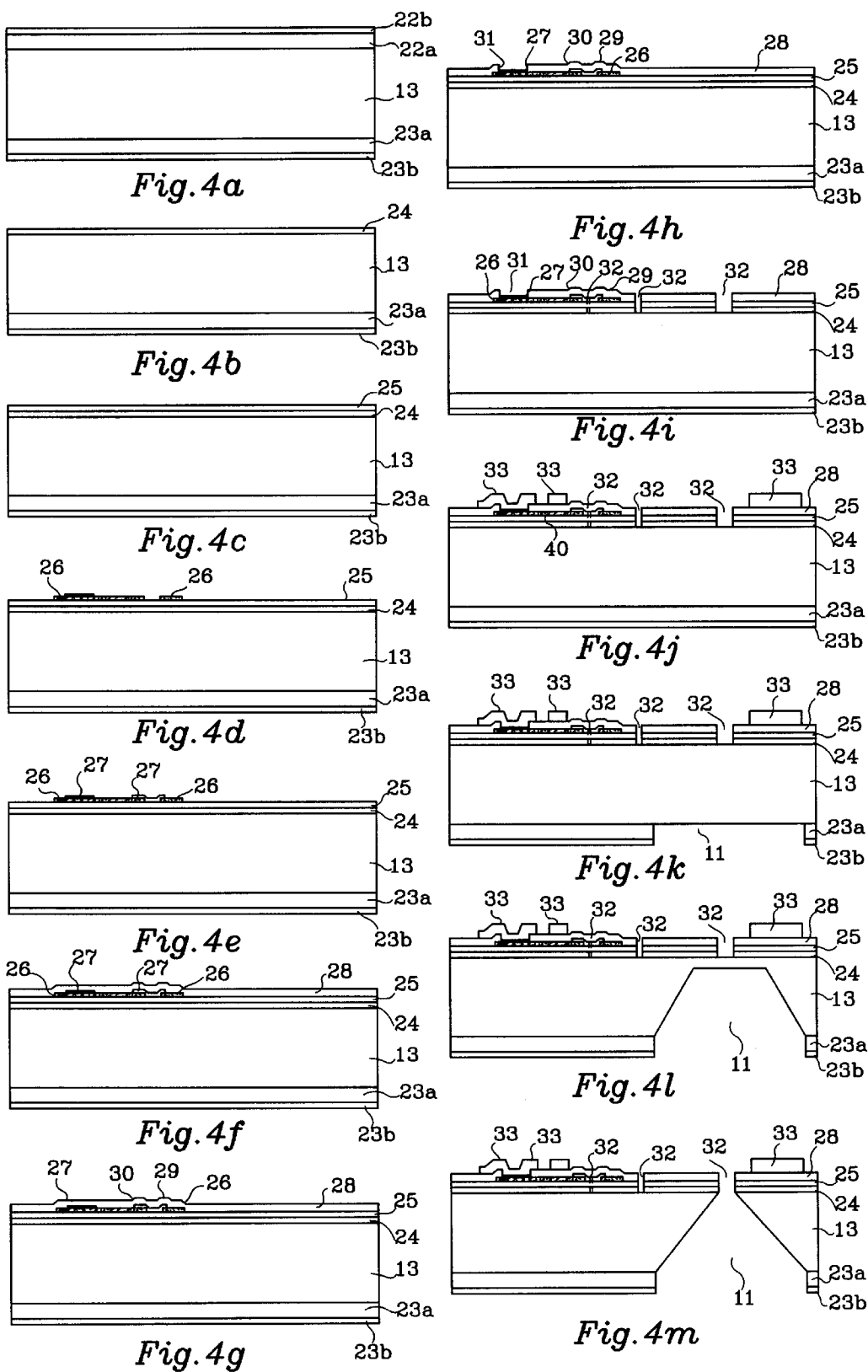

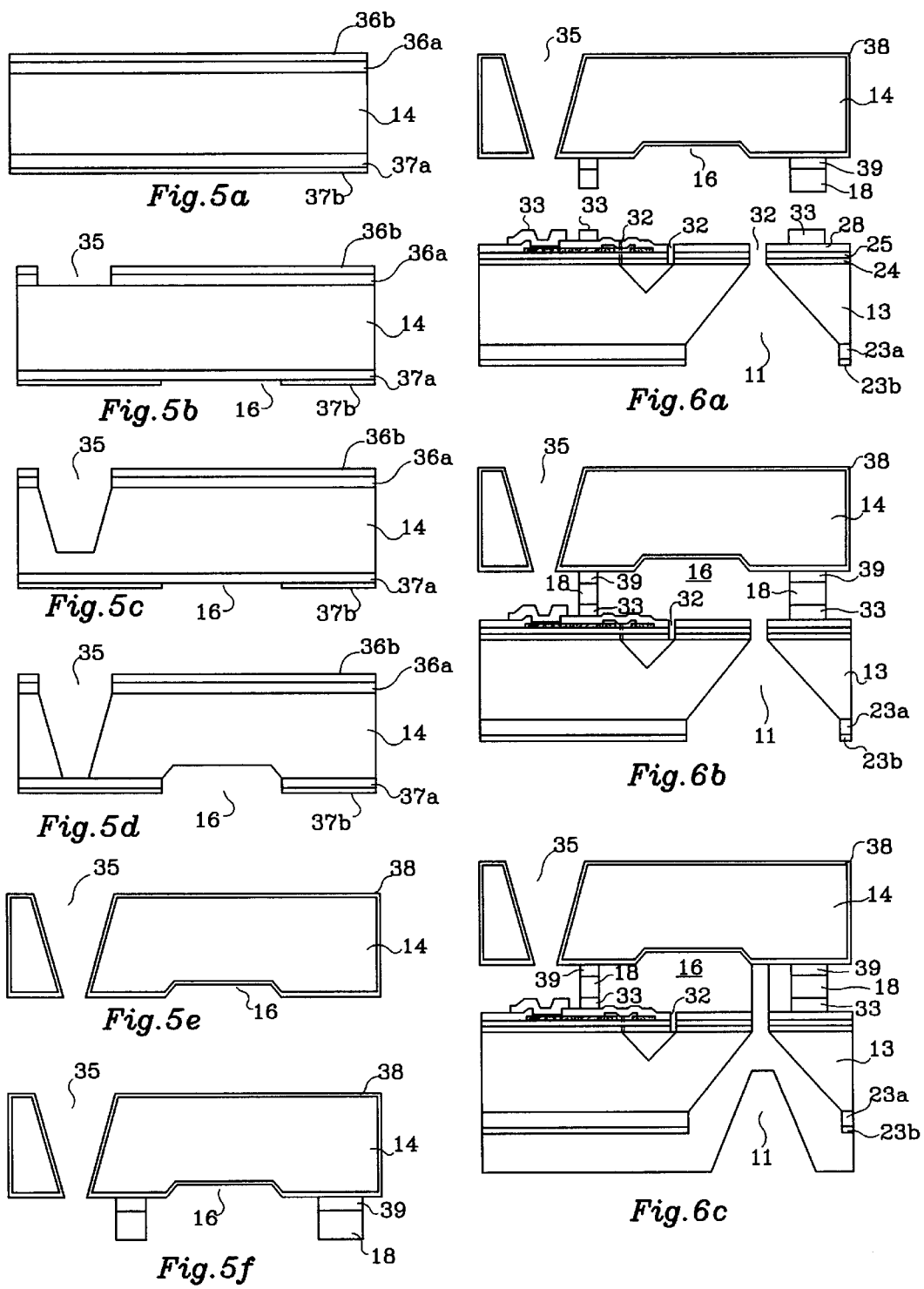

WAFER-PAIR HAVING DEPOSITED LAYER SEALED CHAMBERS

The Government may have rights in this invention pursuant to Contract No. MDA972-95-3-002 awarded by the DARPA.

BACKGROUND

The present invention pertains to vacuum encapsulated microstructure devices. It, in particular, pertains to the vacuum seal of a cavity between two wafers, and, more particularly, to such two wafers having a plugable hole for evacuation of gases from the cavity.

Various devices, such as microstructure infrared (IR) devices, require vacuum encapsulation for optimal performance. Conventional vacuum packaging is complex and costly. Known prior art approaches to wafer level vacuum sealing cannot yield adequately low pressures, the best in the range of 0.5 torr. Such pressures resulted in 50 percent signal losses for thermoelectric (TE) devices as an example.

SUMMARY OF THE INVENTION

The present invention involves the sealing of two wafers together resulting in a cavity between the wafers with a plugable hole for the evacuating of gases from the cavity. The hole, after evacuation of gases from the cavity, is plugged with deposited metal. The result is an integral vacuum package (IVP). This approach permits the sealing of the two wafers together without having to create the vacuum seal at the same time. The final vacuum seal can be done in a high vacuum by either evaporation or the sputtering of a thick layer of metal to plug the small pump-out port. This approach allows a thorough baking out of the wafer to wafer seals and interior surfaces prior to a final vacuum seal. It separates the two functions and does not limit the bake-out to the solder processing steps. There is independent control over sealing and bake-out to maximize bond yield and minimize residual pressure. This approach also permits clear access of each vacuum cavity directly, thereby avoiding the need to pump from the periphery of the wafer inwards. The procedure here has been implemented and resulted in vacuum levels below 10 millitorr of residual pressure as measured by pressure sensors within the cavity. The seals cover significant substrate topography. Seals over topography of 0.25 microns have been demonstrated. The required processing temperatures are below 300 degrees Centigrade (C.). These chips can be handled with conventional chip handling equipment. Yields for this process exceed 90 percent. Costs of the present vacuum-sealed chips are 80 to 90 percent less than that of conventionally vacuum-sealed chips. The present approach results in sealed TE devices that have high temperature longevity for pressures below 100 millitorr; ten years is indicated by test data for ambient temperatures up to 150 degrees C.

BRIEF DESCRIPTION OF THE DRAWING

FIGS. 4a, 4b, 4c, 4d, 4e, 4f, 4g, 4h, 4i, 4j, 4k, 4l and 4m illustrate the fabrication process for a detector wafer.

FIGS. 5a, 5b, 5c, 5d, 5e and 5f illustrate the fabrication process for a top cap wafer.

FIGS. 6a, 6b and 6c illustrate the steps of aligning, bonding and sealing the detector and top cap wafers.

DESCRIPTION OF THE EMBODIMENT

Figure 1A:
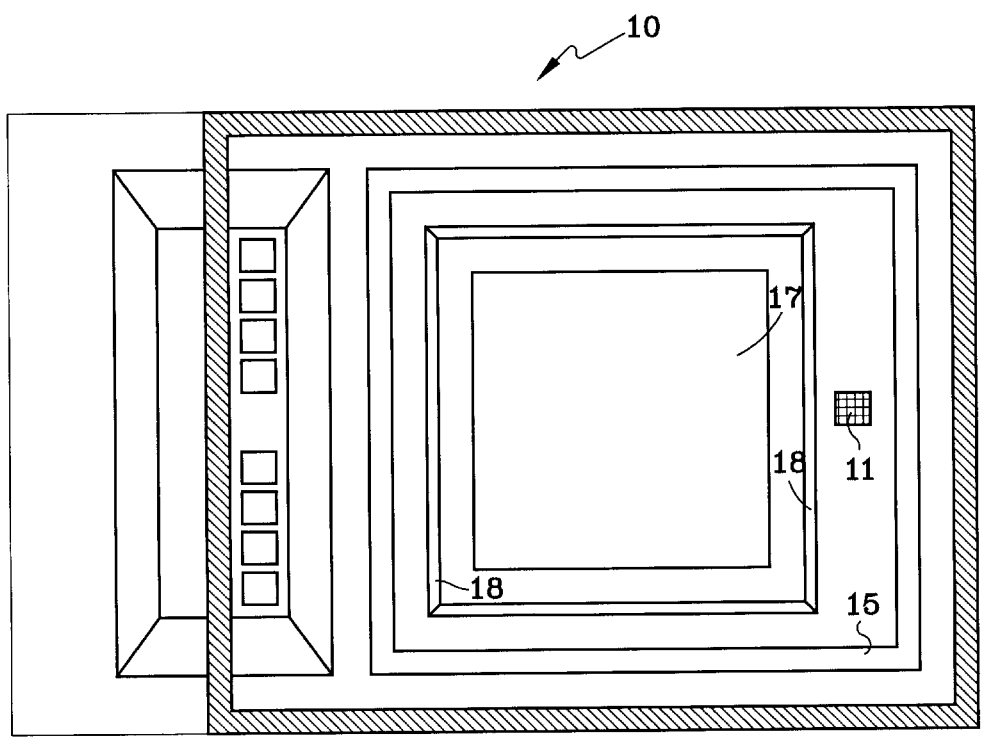
FIGS. 1a and 1b show plan and cutaway side views of a detector chip having a chamber with at least one port sealed by a deposited layer.
Figure 1B:
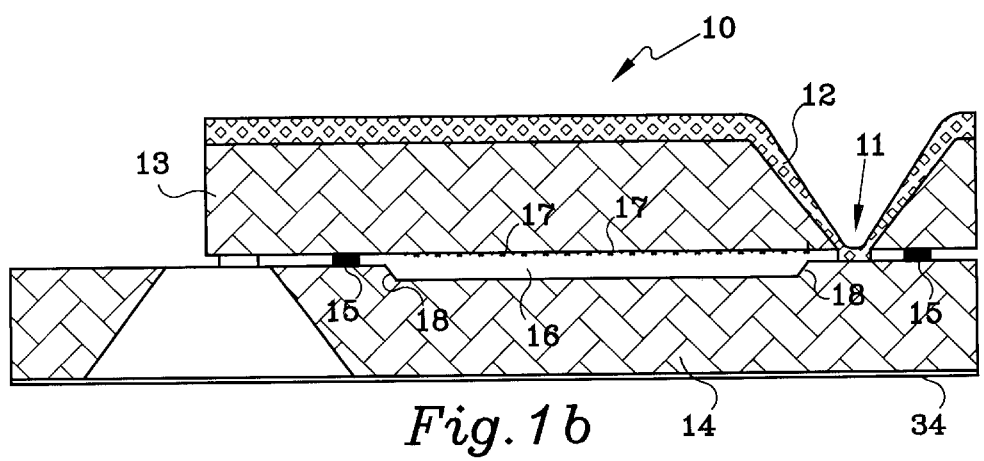
Figure 2:
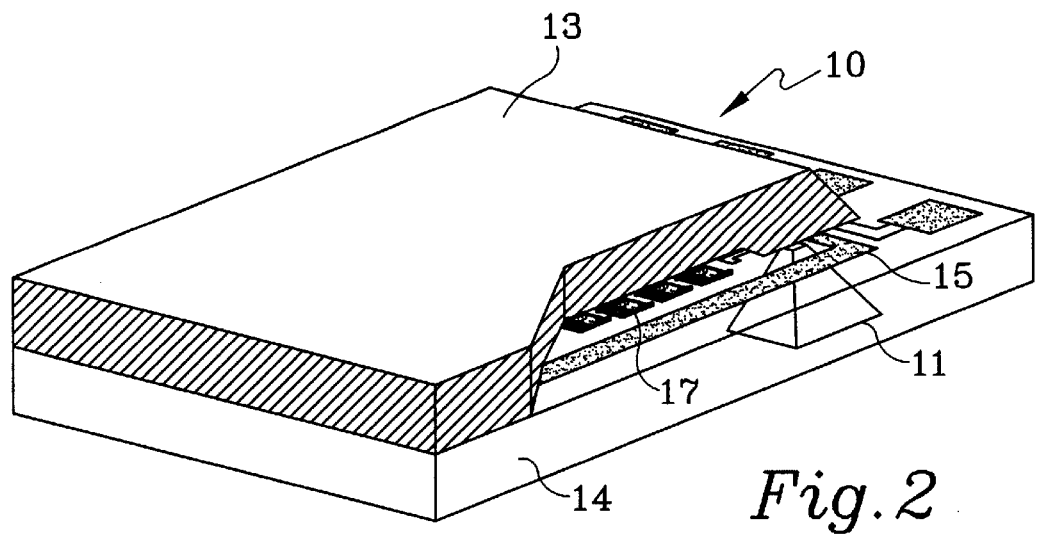
FIG. 2 shows a perspective view of the detector chip having at least one port sealed by deposited layer.

FIGS. 1a, 1b and 2 show an illustration of a device 10 having at least one vacuum pump-out port 11 and a deposited plug final vacuum seal 12. The deposited layer 12 seals plug 11 to hermetically seal chamber 16. Wafers 13 and 14 are of the same material, such as silicon, thereby having the same coefficients of thermal expansion. Wafers 13 and 14 are adhered together at a solder seal ring 15. Wafer 13 is the detector chip and wafer 14 is the top cap. Cavity 16 is the chamber that contains an array 17 of detectors on the surface of wafer 13 and detects radiation which may come through an anti-reflective coated silicon window of top cap 14.

Cavity 16 is effected by a recess of about 125 microns into wafer 14 having a border 18. It is this cavity that is outgassed to result in a cavity vacuum. Top cap 14 is about 430 microns thick and chip 13 is about 500 microns thick. Seal ring 15 is a composition of 90 percent lead and 10 percent indium. Plug 12 is about 20 microns thick and is a composition of 50 percent lead and 50 percent indium.

Figure 3:
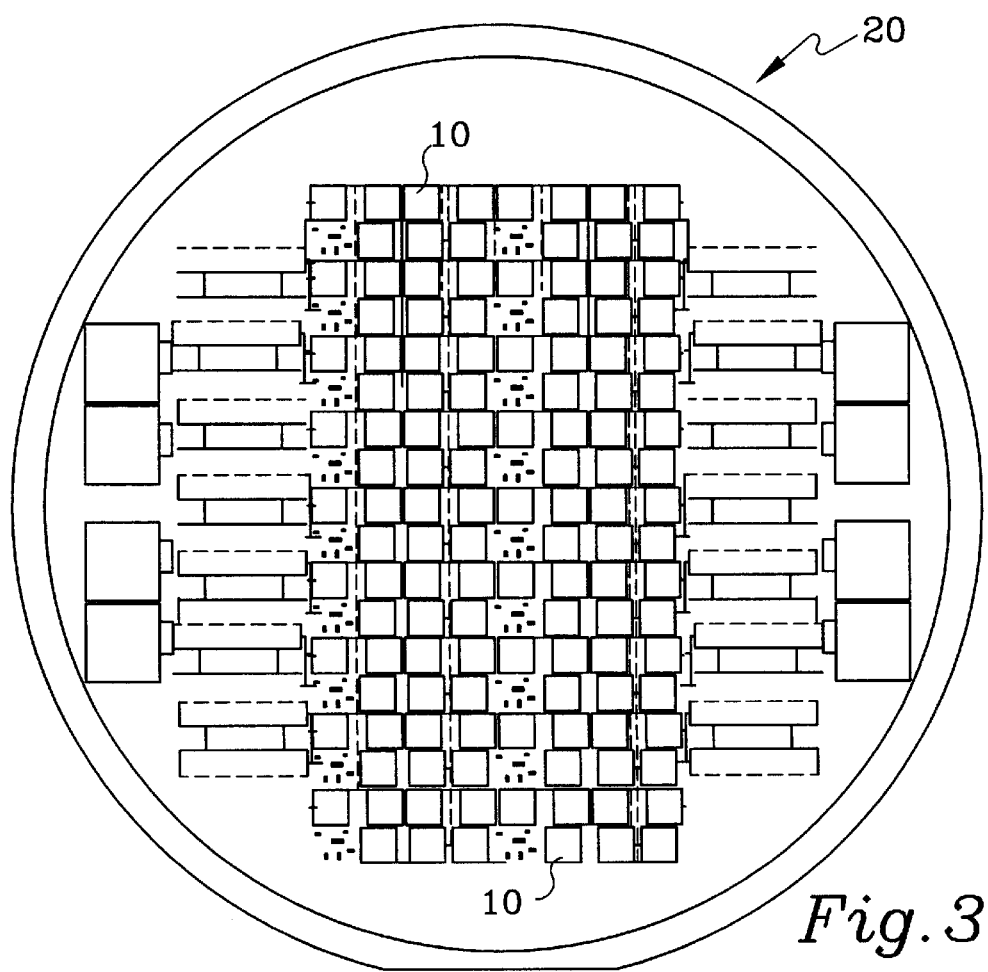
FIG. 3 reveals a wafer having a plurality of detectors with a deposited vacuum seal on a plurality of ports.

FIG. 3 shows a wafer 20 having multiple chips 10 having a wafer-to-wafer sealing of the same material with for multiple cavities. Cavities 16 can be baked out and outgassed since each chamber 16 has an open port 11. Then in an environment of a vacuum, a deposition of metal 12 is applied to the wafer 13 surface having ports 11 and thereby close ports 11 and seal chambers 16 closed with a vacuum in the chambers. Solder balls for sealing of the ports closed has been tried with little success of maintaining a vacuum or low pressure in the cavities. The present wafers 13 and 14, after bonding and sealing, may be sawed into individual chips without breakage since the sealed top cap protects the fragile microstructure devices 17. Further, the plug will not be disturbed since it is a deposited layer 12 rather than some dislodgable solder ball or plug.

A process for developing chip 10 is shown in FIGS. 4a through 4m. The process for detector wafer 13 starts out with a double polished (100) silicon wafer 13. In FIG. 4a, one micron layers 22a and 23a of thermal $SiO_2$ are grown on wafer 13, and 0.3 micron layers 22b and 23b of low pressure chemical vapor deposited (LPCVD) $Si_3N_4$. $Si_3N_4$ layer 22b and $SiO_2$ layer 22a are removed from the "front" of wafer 13. A 1000 angstroms of a thermal $SiO_2$ layer 24 is grown on the front of wafer 13 in FIG. 4b. A layer 25 of 2000 angstroms of $Si_3N_4$ (bottom bridge nitride) is deposited on layer 24 in FIG. 4c. The first metal NiFe (60:40) of a thermocouple is deposited as a 1100 angstrom layer 26 on layer 25 and then first metal layer 26 is patterned with a first mask by ion milling resulting in the layout of FIG. 4d.

For the second metal of the thermocouple detectors, a thousand angstrom layer 27 of chromium is deposited on layers 25 and 26. Layer 27 in FIG. 4e is patterned with a second mask by ion milling and wet etching. A layer 28 consisting of 6000 angstroms of $Si_3N_4$ is deposited on metal layers 26 and 27, and layer 25, as the top bridge nitride in FIG. 4f. An absorber 29 is deposited on layer 28 of FIG. 4g and patterned with a third mask. Absorber 29 is capped with a layer 30 of $Si_3N_4$. Plasma etched vias 31 to metal layer 27 are patterned and cut with the use of a fourth mask, as shown in FIG. 4h. Plasma etched vias 32 in FIG. 4i for the final etch are patterned and cut with the use of a fifth mask. Five hundred angstroms of Cr, 2000 angstroms of Ni and 5000 angstroms of Au are deposited, patterned and lifted off for pad and solder frame metal 33 in FIG. 4j. Passivated leadouts 40 in first metal 26 or second metal 27 pass under the seal ring metal 33 in FIG. 4j. Plasma etched pump-out port vias 11 are patterned and cut on layers 23b and 23a of the back of wafer 13 in FIG. 4k. There is a KOH etch of the back side of wafer 13 through 90 percent of wafer 13 for port 11 in FIG. 4l. Port 11 is completed with an etch through via 32 to the front of wafer 13 as shown in FIG. 4m.

Top cap wafer 14, like detector wafer 13, is fabricated with films compatible with 300 degree C. bakes and low outgassing. Wafer 14 acts as the window for infrared devices 17. An additional constraint is that wafer 14 is made from low oxygen silicon (i.e., float zone silicon) to minimize the $SiO_2$ absorption peak in the 8–14 micron wavelength window. Top cap wafer 14 is coated with an anti-reflection coating 34. Wafer 14 has a solder adhesion metal and solder ring 15 which matches detector wafer 13, a border 18 forming chamber 16 above detectors 17, and holes 35 through wafer 14 to access the wire bond pads on detector wafer 13.

FIGS. 5a through 5f illustrate steps of fabrication for top cap 14. The starting material is a double polished (100) silicon wafer 14 grown by float zone for minimum oxygen content. 1.8 micron layers of thermally grown $SiO_2$ 36a and 37a in FIG. 5a are covered by 0.3 microns of LPCVD $Si_3N_4$ layers 36b and 37b to mask the KOH etching. Pattern and cut via 35 by plasma etching on outside layers 36a and 36b and recess 16 on inside layer 37b of $Si_3N_4$ in FIG. 5b. The wafer 14 is then put in a fixture to allow etching of the outside surface 35 and 36b while protecting the inside 16 and 37b to KOH etch wafer 14 through hole 35 to 90 percent of the way through top cap wafer 14, as shown in FIG. 5c. Wafer 14 is removed from the etching fixture and hole 16 is cleared of remaining $SiO_2$ layer 37a in FIG. 5d by buffered oxide etch. Hole 35 is further etched through wafer 14 to layer 37a to complete bond pad hole 35. Also, FIG. 5d shows the etching that creates recess 16 on the inside of wafer 14. Nitride and oxide mask layers 36a, 36b, 37a and 37b are stripped from wafer 14. Antireflective coating 38 is applied to wafer 14. A solder ring pattern is applied to the inside surface encircling recess 16, by using a laminated Riston process for lift-off. Five hundred angstroms of Ti, 2000 angstroms of Ni and 500 angstroms of Au of adhesion metals 39 are deposited in an E-beam evaporator. A five micron layer 40 of InPb (10:90) solder is deposited onto adhesion metals 39 in the thermal evaporator. The Riston mask is lifted off and the field $SiO_2$ in BOE etched off resulting in solder ring 18 in FIG. 5f.

Bonding and sealing detector wafer 13 and top cap wafer 14 are done with clean surfaces. Bonding surfaces of wafers 13 and 14 are sputter cleaned just prior to doing the wafer bond. The following sequence of events indicate how to align, bond and seal the wafer pair 13 and 14 of FIGS. 6a, 6b and 6c. To begin, the Au solder ring surface 33 of detector wafer 13 is sputter cleaned. The InPb surface of ring 18 of top cap wafer 14 is oxygen plasma cleaned. Wafers 13 and 14 of FIG. 6a are aligned in a bonding cassette using 0.002 inch spacers between the wafers. The aligned wafer pair is put in a vacuum press which is pumped to a good vacuum with a turbo pump. Wafers 13 and 14 are pressed together in FIG. 6b, with about 400 pounds of pressure. The temperature of the wafers is ramped up to 300 degrees C., which takes about one hour. Then wafers 13 and 14 are held at this achieved temperature and pressure for five minutes. Then wafers 13 and 14 are cooled down to room temperature, and the vacuum chamber is vented.

Bonded wafer pair 13 and 14 is put into an E-beam evaporation system for sputter cleaning of the pump-out port 11 surfaces, followed by adhesion layers of 500 angstroms of Ti, 1000 angstroms of Ni and 500 angstroms of Au. Wafer pair 13 and 14 is put into a thermal evaporator system; and a bake out of the wafer pair at 250 degrees C. is preferred for four hours under a vacuum. The wafer pair 13 and 14 is cooled down but the environment about the wafer pair is kept at the desired vacuum. Twenty microns of InPb (50:50) 12 is deposited onto the backside of detector wafer 13 to plug port 11 in FIG. 6c, to seal vacuum chamber 16 of wafer pair 13 and 14. On the wafer 20 scale, a plurality of ports 11 in a plurality of chips are plugged. Then wafers 13 and 14, combined as wafer 20, may be removed from the vacuum environment. Wafer 20 may be cut into individual chips 10, each having its own sealed chamber 16 enclosing detectors 17.

Further variations on this theme include top cap wafer 14 composed of Germanium for better IR transmission or ZnSe for broadband transmission (i.e., visible and IR) or other optical window materials for application specific optical bandpass behavior. Top cap wafer 14 may have integrated components built in or on the surface in addition to those on the detector wafer 13. Detector wafer 13 having a diaphragm pressure sensor integrated into it, the sealed chamber then forms a vacuum pressure reference. Detector wafer 13 may have infrared bolometer arrays with readout electronics integrated into the wafer. Detector wafer 13 may have moving parts to be sealed in a chamber for other functional purposes. The bonded wafer pair 13 and 14 in FIG. 6c may be hermetically sealed with a controlled residual pressure of a specific gas type for optimal thermal, mechanical or other properties rather than simply evacuated for the devices within the chamber.

What is claimed is:

1. A wafer-pair having at least one sealed chamber, comprising:
   a first wafer having at least one recess;
   a sealing ring formed from solder for each at least one recess and situated on said first wafer beyond a periphery of said at least one recess;
   a second wafer, situated on said sealing ring of each at least one recess to form at least one chamber from each recess, said sealing ring having been heated to an elevated temperature to form an hermetic wafer to wafer seal prior to evacuation of said at least one chamber, and having a port within said periphery of each of said sealing rings; and
   a layer of deposited solder on said second wafer for plugging the port within said periphery of each of said sealing rings to seal the at least one chamber said layer of deposited metal being applied to said second wafer subsequent to said second wafer having been situated on said chamber at a temperature lower than that at which said sealing ring softens and subsequent to evacuation of said chamber.

2. The wafer-pair of claim 1, wherein at least one chamber contains at least one device.

3. The wafer-pair of claim 2, wherein the at least one device is a thermoelectric device.

4. The wafer-pair of claim 3, wherein the at least one device is a bolometer.

5. A wafer-pair having a plurality of sealed volumes, comprising:
   a first wafer having a plurality of recesses;
   a second wafer proximate to said first wafer;
   a ring of metal sealing material, situated between said first and second wafers about a periphery of each recess of the plurality of recesses to form a plurality of chambers and attached to said first and second wafers by having heated said at least one recess to an elevated temperature to form an hermetic wafer to wafer seal for each recess of said plurality of recesses;

said second wafer having a plurality of ports, at least one port being within the periphery of each recess of said plurality of recesses; and a layer of sealing material deposited on said second wafer for plugging the plurality of ports and resulting in said plurality of chambers having been hermetically sealed, said layer of deposited metal being applied at a temperature lower than that at which said sealing ring softens and subsequent to evacuation of said chambers;

said wafer pair, said wafer pair being divided into a plurality of chips, wherein each chip of the plurality of chips, has at least one hermetically sealed volume of the plurality of hermetically sealed volumes.

6. The wafer-pair of claim 5, wherein the at least one hermetically sealed volume contains at least one device.

7. The wafer-pair of claim 6, wherein the at least one device is a thermoelectric detector.

8. The wafer-pair of claim 7, wherein the at least one device is a bolometer.

9. A wafer-pair having a sealed chamber, comprising:

a first silicon wafer having a port from a first side through said first wafer to a second side;

a second silicon wafer having a recess on a first side, the first side of said second wafer bonded to the second side of said first wafer; and a sealing ring for said recess and situated on said second wafer beyond a periphery of said at least one recess, said sealing ring having been heated to an elevated temperature to form an hermetic wafer to wafer seal prior to evacuation of said at recess;

a layer of material formed on the first side of said first wafer including the port; and wherein the recess has been sealed from an ambient environment of said first and second wafers, and at a temperature lower than that at which said sealing ring softens:;

said wafer-pair further comprising detectors formed on the second side of said first wafer and situated within the chamber, wherein said second wafer is a window between said detectors and the ambient environment.

10. A wafer-pair, comprising:

a first silicon wafer having a port from a first side through said first wafer to a second side; and a second silicon wafer having a plurality of recesses on a first side, the first side of said second wafer bonded to the second side of said first wafer to form a hermetic wafer to wafer seal; and wherein each recess of the plurality of recesses forms a chamber having at least one port of the plurality of ports;

said first and second wafers are situated in an ambient environment of a vacuum resulting in a vacuum in each chamber formed by each recess of said plurality of recesses; and a layer of material is formed on the first side, including a plurality of ports, of said first wafer, resulting in each chamber having been sealed from the ambient environment and at a temperature lower than that at which said hermetic wafer to wafer seal is softened;

each of said chambers having at least one detector situated therein; and wherein said second wafer is a window between the at least one detector in each chamber and the fist ambient environment;

said first and second wafers being cut into pieces having one or more sealed chambers.

11. A wafer-pair, comprising:

a first silicon wafer;

a plurality of bolometer devices formed on a first side of said first silicon wafer;

a plurality of pump-out ports formed in said first silicon wafer between first and second sides of said first silicon wafer; and a second silicon wafer having a plurality of recesses and a plurality of seal rings formed on the first side of said second silicon wafer; and wherein:

the first side of said second silicon wafer is bonded to the first side of said first silicon wafer via the sealing rings to form a hermetic wafer to wafer seal;

the plurality of recesses in conjunction with the plurality of sealing rings and the first side of said first silicon wafer, form a plurality of chambers;

each chamber of the plurality of chambers encloses at least one bolometer device of said plurality of bolometer devices and at least one pump-out port of said plurality of pump-out ports; and a layer of material deposited on said plurality pump-out ports on the second side of said first silicon wafer each chamber having been sealed from the ambient environment and at a temperature lower than that at which said hermetic wafer to wafer seal is softened;

each of said chambers of the plurality of chambers being sealed and has a pressure of less than 0.5 torr.

12. The wafer-pair of claim 11, wherein each chamber of the plurality of chambers is sealed and has a pressure of less than 0.5 torr.

13. The wafer-pair of claim 11, wherein said detectors have electrical connections passing beneath said seal ring.

14. A wafer-pair, comprising:

a first silicon wafer;

a plurality of devices formed on a first side of said first silicon wafer;

a plurality of pump-out ports formed in said first silicon wafer between first and second sides of said first silicon wafer; and a second silicon wafer having a plurality of recesses and a plurality of seal rings formed on the first side of said second silicon wafer; and wherein:

the first side of said second silicon wafer is bonded to the first side of said first silicon wafer via the sealing rings;

the plurality of recesses in conjunction with the plurality of sealing rings and the first side of said first silicon wafer, form a plurality of sealed chambers each having a pressure of less than 0.5 torr;

each chamber of the plurality of chambers encloses at least one device of said plurality of devices and at least one pump-out port of said plurality of pump-out ports; and a layer of material deposited on said plurality pump-out ports on the second side of said first silicon wafer each chamber having been sealed from the ambient environment and at a temperature lower than that at which said hermetic wafer to wafer seal is softened.

15. The wafer-pair of claim 14, wherein the plurality of devises comprises thermoelectric detectors.

16. The wafer-pair of claim 15, wherein the plurality of devises comprises thermoelectric bolometers.

17. The wafer-pair of claim 16, wherein the plurality of devises comprises emitters.

* * * * *